US006605225B1

United States Patent
Yamashita et al.

(10) Patent No.: US 6,605,225 B1
(45) Date of Patent: Aug. 12, 2003

(54) METHOD AND APPARATUS FOR FABRICATING THREE DIMENSIONAL ELEMENT FROM ANISOTROPIC MATERIAL

(75) Inventors: Tsutomu Yamashita, Miyagi (JP); Sang-Jae Kim, Sendai (JP)

(73) Assignee: Japan Science and Technology Corporation (JP)

( * ) Notice: Subject to any disclaimer, the term of this patent is extended or adjusted under 35 U.S.C. 154(b) by 0 days.

(21) Appl. No.: 09/646,701

(22) PCT Filed: Jan. 21, 2000

(86) PCT No.: PCT/JP00/00280

§ 371 (c)(1),
(2), (4) Date: Sep. 21, 2000

(30) Foreign Application Priority Data

Jan. 26, 1999 (JP) ............................................. 11-016491

(51) Int. Cl.[7] ............................................. H01L 39/22
(52) U.S. Cl. ............................ 216/3; 505/329; 505/832; 505/922
(58) Field of Search ............................ 216/3; 505/329, 505/817, 832, 922

(56) References Cited

U.S. PATENT DOCUMENTS

| 4,966,885 | A | * | 10/1990 | Hebard ............................ 216/3 |
| 5,677,011 | A | * | 10/1997 | Hatakeyama et al. ........ 427/497 |
| 5,719,105 | A | * | 2/1998 | Odagawa et al. .............. 257/33 |
| 5,981,443 | A | * | 11/1999 | Wen ................................ 216/3 |

FOREIGN PATENT DOCUMENTS

| JP | 07235700 A | * | 9/1995 | ............ H01L/39/22 |
| JP | 08228029 A | * | 9/1996 | ............ H01L/39/22 |
| JP | 08254852 A | * | 10/1996 | ............ G03G/09/08 |
| JP | 09064643 A | * | 3/1997 | ............ H03B/15/00 |
| JP | 09259810 A | * | 10/1997 | ............ H01J/37/252 |
| JP | 10111223 A | * | 4/1998 | ............ G01N/01/28 |

* cited by examiner

*Primary Examiner*—Michael W. Ball
*Assistant Examiner*—John T. Haran
(74) *Attorney, Agent, or Firm*—Lorusso, Loud & Kelly

(57) ABSTRACT

A three-dimensional element is fabricated from a high-temperature superconductor. The method and apparatus can fabricate, for example, a single-electron tunnel device or an intrinsic Josephson device which utilize the layer structure peculiar to the high-temperature superconductor, with machining from the side surface of a monocrystal or thin film. In the focused-ion beam etching, a substrate holder which is rotatable about 360°, is rotated, at the minimum, through an angle of about 90°, and the thin film or monocrystal on the substrate is etched from the side surface thereof so as to fabricate the element. After the thin film or monocrystal is machined from above by means of an focused-ion beam to thereby form a bridge having a junction length, the sample is rotated by about 90° (270°). Subsequently, a multi-layer current path layer is formed through side-surface machining. The junction length is accurately controlled through measurement of the current path length from an image display.

19 Claims, 9 Drawing Sheets

FIG. 3(a)
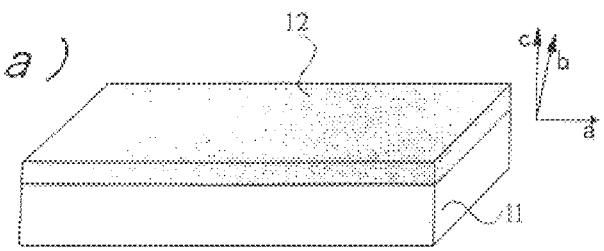
FIG. 3(b)
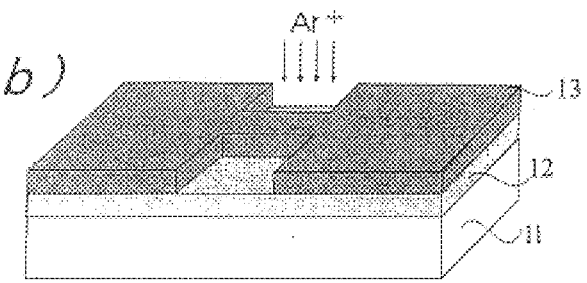
FIG. 3(c)
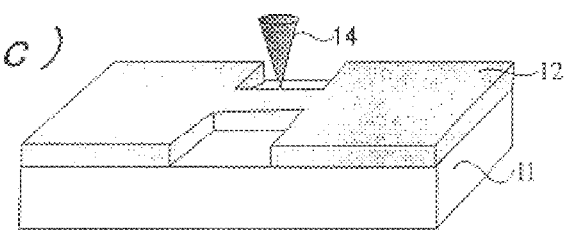
FIG. 3(d)
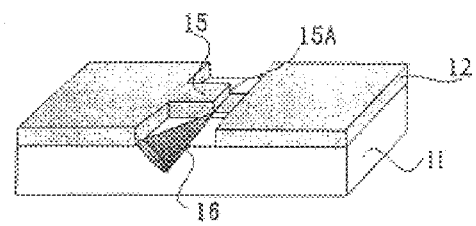
FIG. 3(d')
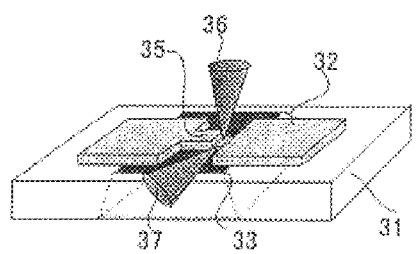
FIG. 3(e)
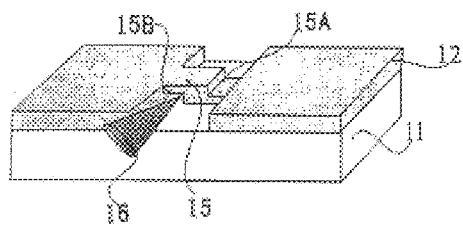
FIG. 3(e')
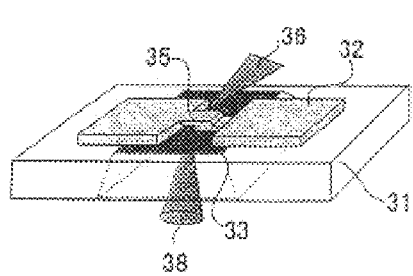

(a)      (b)

METHOD AND APPARATUS FOR FABRICATING THREE DIMENSIONAL ELEMENT FROM ANISOTROPIC MATERIAL

CROSS-REFERENCE TO RELATED APPLICATIONS

This application is a National Phase Application (35 USC 371) of PCT/JP00/00280 and claims priority of Japanese Application No. 11-16491, filed Jan. 26, 1999.

TECHNICAL FIELD

The present invention relates to a method and apparatus for fabricating a three-dimensional element from an anisotropic material, and more particularly to a method and apparatus for fabricating a three-dimensional element from a thin film or monocrystal of high-temperature superconductive material by means of focused-ion-beam machining performed in accordance with a special fabrication method.

BACKGROUND ART

A conventional focused-ion-beam etching apparatus can assume an inclined orientation at an angle as large as 60°. Further, machining an object from a side surface thereof has not been attempted.

Conventionally, in order to obtain an intrinsic Josephson effect, supercurrent must be caused to flow through a stack of monocrystals of a high-temperature superconductor having a layer structure (herein after simply called as a "layered high-temperature superconductor"), in the stack direction. Further, in order to obtain a practical device, the length of a path for supercurrent must be adjusted with an accuracy corresponding to the size of crystals.

FIG. 1 is a schematic cross section of such a conventional electronic element.

In FIG. 1, reference numeral 101 denotes a stack of high-temperature superconductive monocrystals; reference numeral 102 denotes a projection formed by the stack of superconductive monocrystals; reference numeral 103 denotes an insulating layer formed on the surface of the stack of superconductive monocrystals 101 excluding the projection 102; and reference numeral 104 denotes an electrode connected to the projection 102.

Such a conventional electronic element is fabricated in such a manner that the fine projection 102 is formed on the top surface of the stack of superconductive monocrystals 101 by use of a chemical or physical etching technique, and is used in a state in which supercurrent is caused to flow through the stack of superconductive monocrystals 101 in the stack direction.

Conventionally, in order to obtain a single-electron tunnel element, a tunnel junction layer must be formed with sub-picometer accuracy, in order to decrease its electrostatic capacitance. Therefore, the reproducibility of the element is poor. Further, the element operates at very low temperature (1 K or lower) only.

Moreover, in the conventional method of fabricating an electronic element, the element is formed through machining performed from the top surface of a monocrystal or thin film. Therefore, the uniformity of the surface has been important.

Furthermore, a conventional mesa-type electronic element for obtaining the intrinsic Josephson effect cannot be formed on a substrate having a hole.

DISCLOSURE OF THE INVENTION

As described above, the conventional process for fabricating an electronic element involves the following problems.

(1) A conventional intrinsic Josephson device cannot be fabricated by use of a c-axis-oriented thin film formed of a layered high-temperature superconductor of high quality, because the length of a supercurrent path cannot be controlled accurately.

(2) A single-electron tunnel device requires machining within a very small area whose sides are shorter than one picometer, thereby rendering reproducibility poor. Further, fabrication of a device utilizing a stack of c-axis-oriented thin films of high quality has been impossible.

(3) Since a conventional focused-ion-beam etching apparatus can assume an inclined orientation at an angle as large as 60°, a superconductive thin film on a substrate cannot be etched from a side surface thereof.

(4) When a monocrystal is used, a conventional process requires complicated steps, such as both-face machining and reversing of a sample, and many samples break in these steps. Further, since machining is performed from the top face of a substrate, machining accuracy in the depth direction is affected by surface uniformity.

An object of the present invention is to solve the above-described problems and to provide a method and apparatus for fabricating a three-dimensional element from an anisotropic material. Examples of the three-dimensional element include a single-electron tunnel device and an intrinsic Josephson device which utilize a layer structure peculiar to a layered high-temperature superconductor. The three-dimensional element can be fabricated from a stack of c-axis-oriented thin films formed of a layered high-temperature superconductor of high quality, and the length of a tunnel junction can be controlled accurately through measurement of an image displayed on a screen. Further, the fabrication of the three-dimensional element does not require a step of reversing a sample during in-situ machining, and the three-dimensional element can be fabricated through fine area machining from the side surface of a monocrystal or thin film, without being affected by the surface uniformity of the monocrystal or thin film.

To achieve the above object, the present invention provides the following:

[1] A method for fabricating a three-dimensional element by use of an anisotropic material, characterized by comprising the steps of:
forming a thin film having anisotropy and a bridge on a substrate for thin-film growth; and
mounting the substrate onto a sample holder, rotating the sample holder to an angle of 360°, and machining the bridge from the side surface thereof by means of focused-ion-beam machining.

[2] A method for fabricating a three-dimensional element by use of an anisotropic material, characterized by comprising the steps of:
forming a monocrystal having anisotropy and a bridge on a substrate for attachment of the monocrystal; and
mounting the substrate onto a sample holder, rotating the sample holder to an angle of 360°, and machining the bridge from the side surface thereof by means of focused-ion-beam machining.

[3] A method for fabricating a three-dimensional element by use of an anisotropic material described in [1] or [2] above, wherein the bridge is machined three-dimensionally by means of focused-ion-beam machining to thereby obtain a single-electron tunnel junction device which is formed of a layered high-temperature superconductor and which has a tunnel junction layer of a very small area.

[4] A method for fabricating a three-dimensional element by use of an anisotropic material described in [1] or [2] above, wherein the bridge is machined three-dimensionally by means of focused-ion-beam machining to thereby obtain an intrinsic Josephson junction device which is formed of a layered high-temperature superconductor and which has a supercurrent path layer of a very small area.

[5] A method for fabricating a three-dimensional element by use of an anisotropic material described in [3] above, wherein the layered high-temperature superconductor is a c-axis-oriented thin film of a layered high-temperature superconductor, and the single-electron tunnel junction device is a single-electron tunnel junction device which has a tunnel junction layer of a very small area not greater than one square micrometer and utilizes an intrinsic layered structure.

[6] A method for fabricating a three-dimensional element by use of an anisotropic material described in [4] above, wherein the layered high-temperature superconductor is a c-axis-oriented thin film of a layered high-temperature superconductor, and the intrinsic Josephson junction device is an intrinsic Josephson junction device which has a supercurrent path layer of a very small area not greater than one square micrometer and utilizes an intrinsic layered structure.

[7] A method for fabricating a three-dimensional element by use of an anisotropic material described in [3] above, wherein the layered high-temperature superconductor is a c-axis-oriented monocrystal of a layered high-temperature superconductor, and the single-electron tunnel junction device is a single-electron-pair tunnel junction device which has a tunnel junction layer of a very small area not greater than one square micrometer and utilizes an intrinsic layered structure.

[8] A method for fabricating a three-dimensional element by use of an anisotropic material described in [4] above, wherein the layered high-temperature superconductor is a c-axis-oriented monocrystal of a layered high-temperature superconductor, and the intrinsic Josephson junction device is an intrinsic Josephson junction device which has a supercurrent path layer of a very small area not greater than one square micrometer and utilizes an intrinsic layered structure.

[9] A method for fabricating a three-dimensional element by use of an anisotropic material described in [2] above, wherein an intrinsic Josephson junction device using a c-axis-oriented monocrystal of a layered high-temperature superconductor is formed on a substrate having a hole by means of focused-ion-beam machining.

[10] An apparatus for fabricating a three-dimensional element by use of an anisotropic material, characterized by comprising a sample stage which is disposed such that a sufficient clearance is formed between the sample stage and peripheral equipment and which can effect 6-axis motion including a tilting motion from 0° to 360° in both positive and negative directions.

[11] An apparatus for fabricating a three-dimensional element from an anisotropic material, characterized by comprising a sample stage which is equipped with a jig having a slant angle of 30° to 90°.

BRIEF DESCRIPTION OF DRAWINGS

FIGS. 3(a) to 3(e') are perspective views relating to the embodiment of the present invention and showing steps for fabricating the three-dimensional intrinsic Josephson junction device, which is formed through focused-ion-beam machining and which exhibits a single-electron tunnel phenomenon;

BEST MODE FOR CARRYING OUT THE INVENTION

Embodiments of the present invention will next be described in detail.

Figure 1:
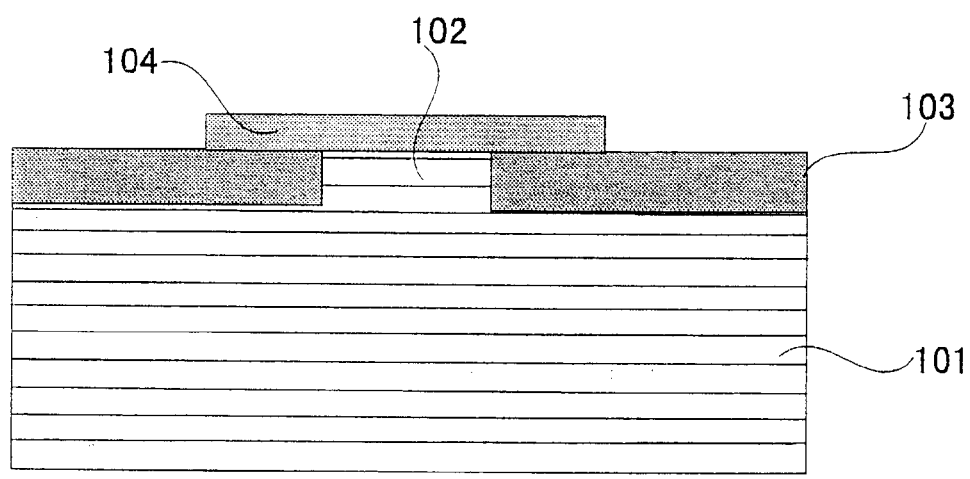
FIG. 1 is a schematic sectional view of a conventional mesa-type intrinsic Josephson junction formed through a process such that a fine projection is formed on a top face of a stack by use of a chemical or physical etching technique and is used in a state in which supercurrent is caused to flow in the stack direction.
Figure 2A:
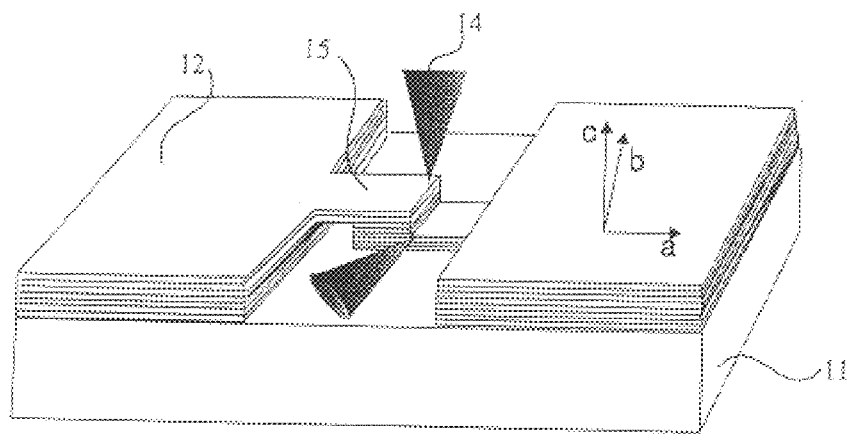
FIGS. 2(a) and 2(b) are views relating to an embodiment of the present invention and showing a structure of a three-dimensional intrinsic Josephson junction device which is formed from a thin film of a high-temperature superconductor through focused-ion-beam machining and which exhibits a single-electron tunnel phenomenon.
Figure 2B:
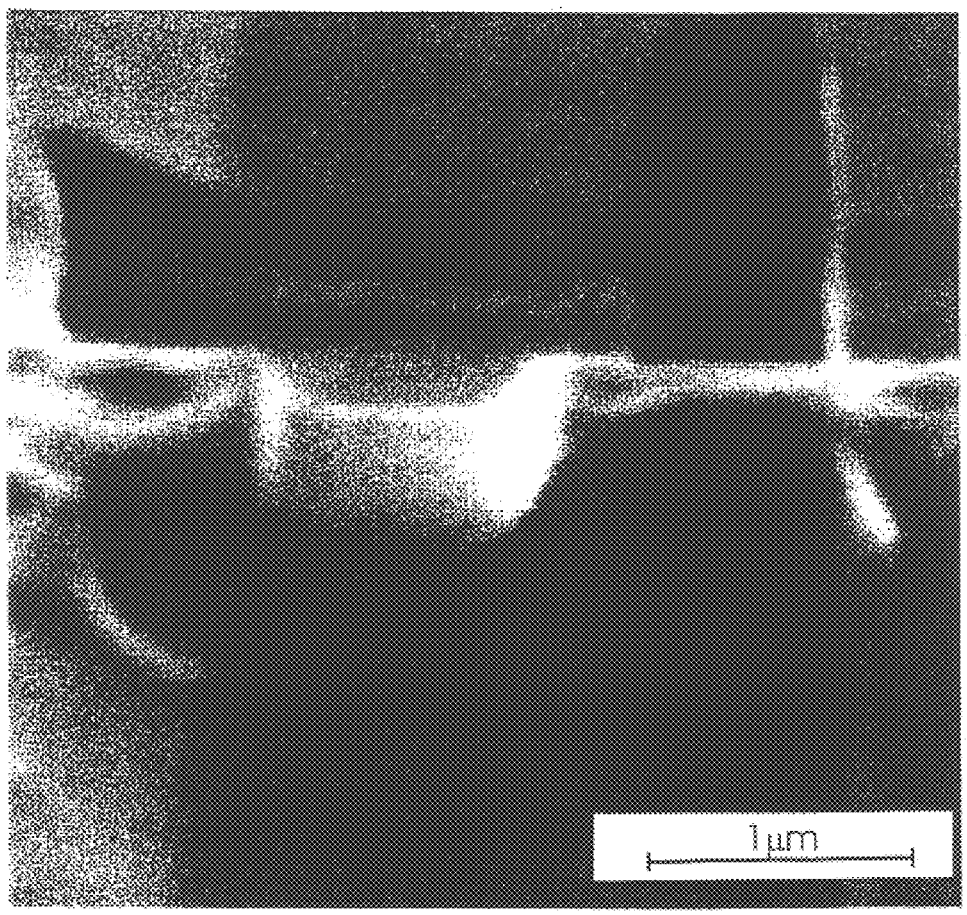

FIGS. 2(a) and 2(b) are views relating to an embodiment of the present invention and showing a structure of a three-dimensional intrinsic Josephson junction device which is formed from a thin film of a high-temperature superconductor through focused-ion-beam machining and which exhibits a single-electron tunnel phenomenon. FIG. 2(a) is a perspective view of the three-dimensional intrinsic Josephson junction device; and FIG. 2(b) is a photograph showing an image of secondary ions of the three-dimensional intrinsic Josephson junction device as actually fabricated.

In FIG. 2(a), reference numeral 11 denotes a substrate such as a monocrystalline substrate (of, for example, MgO) on which a thin film of a layered high-temperature superconductor is grown; reference numeral 12 denotes a layered high-temperature superconductor thin film (of, for example, YBCO); reference numeral 14 denotes a focused ion beam; and reference numeral 15 denotes a bridge. The thin film is oriented along the c axis.

In the present embodiment, the substrate is mounted on a sample holder; the sample holder is rotated to 360°; and the bridge 15 of the layered high-temperature superconductor thin film 12 is machined three-dimensionally from the side surface of the bridge 15 such that a tunnel junction layer of a very small area (not greater than one square micrometer) is formed. Thus, a single-electron tunnel device utilizing the unique layer structure can be fabricated.

FIGS. 3(a) to 3(e') show the embodiment of the present invention and are perspective views showing steps for fabricating the three-dimensional intrinsic Josephson junction device, which is formed through focused-ion-beam machining and which exhibits a single-electron tunnel phenomenon.

The method of fabricating the three-dimensional intrinsic Josephson junction device will be described with reference to FIGS. 3(a) to 3(e').

(1) First, as shown in FIG. 3(a), a substrate 11 (e.g., a monocrystalline substrate (of MgO)) for growth of a layered high-temperature superconductor thin film is prepared, and a layered high-temperature superconductor thin film (of, for example, YBCO) 12 is deposited thereon.

(2) As shown in FIG. 3(b), after a pattern of resist 13 is formed on the sample, the film is roughly etched by conventional wet etching or argon ion etching.

(3) Subsequently, as shown in FIG. 3(c), the resist 13 is removed, and the layered high-temperature superconductor thin film 12 is trimmed by means of a focused ion beam 14.

(4) Subsequently, after the sample is fixed to a holder (not shown) of a focused-ion-beam machining apparatus, as shown in FIG. 3(d), the layered high-temperature superconductor thin film 12 is cut accurately from the top surface thereof by means of a focused ion beam 16 so as to form a bridge 15 having a length and width matched to the size of a junction to be fabricated. The machining is performed by use of gallium (Ga) ions and at an acceleration voltage of 15 to 30 kV and a machining rate of 0.1 to 2.0 $\mu m^3$/min.

(5) Subsequently, the substrate 11 having the layered high-temperature superconductor thin film 12 having undergone machining is placed on a sample holder (not shown) having an inclination of 30°. By means of automatic inclination control of the focused-ion-beam machining apparatus, the sample holder is tilted by 60°, so that machining at an angle of about 90° (270°) is enabled. Specifically, the sample holder is rotated such that the substrate 11 is positioned at the angle of about 90° (270°). Subsequently, as shown in FIG. 3(d), the bridge 15 is machined from the side surface by means of the focussed ion beam 16 such that a stepped portion 15A of the bridge 15 is formed.

(6) Subsequently, as shown in FIG. 3(e), a step portion 15B opposite the stepped portion 15A is machined by means of the focused ion beam 16 from the same side from which the machining shown in FIG. 3(d) is performed, such that the distance between the stepped portions 15A and 15B corresponds to the size of the junction.

In this way, the device of the present embodiment is obtained.

As described above, in the present invention, a stack of c-axis-oriented thin films of a layered high-temperature conductor is machined by use of a fine machining technique using a focused ion beam. Therefore, an element having an area smaller than one square micrometer can be fabricated. Further, since the stack of layered high-temperature conductor films is machined and observed from the side surface thereof, it becomes possible to fabricate a device in such a manner that the number and areas of junctions can be controlled accurately, which have been difficult to achieve in conventional intrinsic Josephson junction devices. Further, when the capacitance of an element is controlled through control of the number and areas of junctions, a single-electron device which is formed from a layered high-temperature superconductor and which can operate at high temperature can be fabricated with high reproducibility.

Next, there will be described a method according to another embodiment of the present invention and adapted to fabricate a three-dimensional intrinsic Josephson junction device which is formed through focused-ion-beam machining and which exhibits a single-electron tunnel phenomenon.

Figure 4:
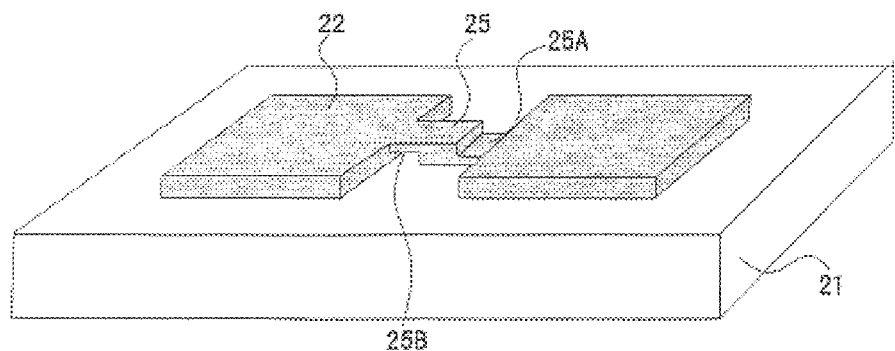
FIGS. 4(a) and 4(b) are a perspective view and a photograph relating to the embodiment of the present invention and showing the three-dimensional intrinsic Josephson junction device, which is formed through focused-ion-beam machining and which exhibits a single-electron tunnel phenomenon.
Figure 4:
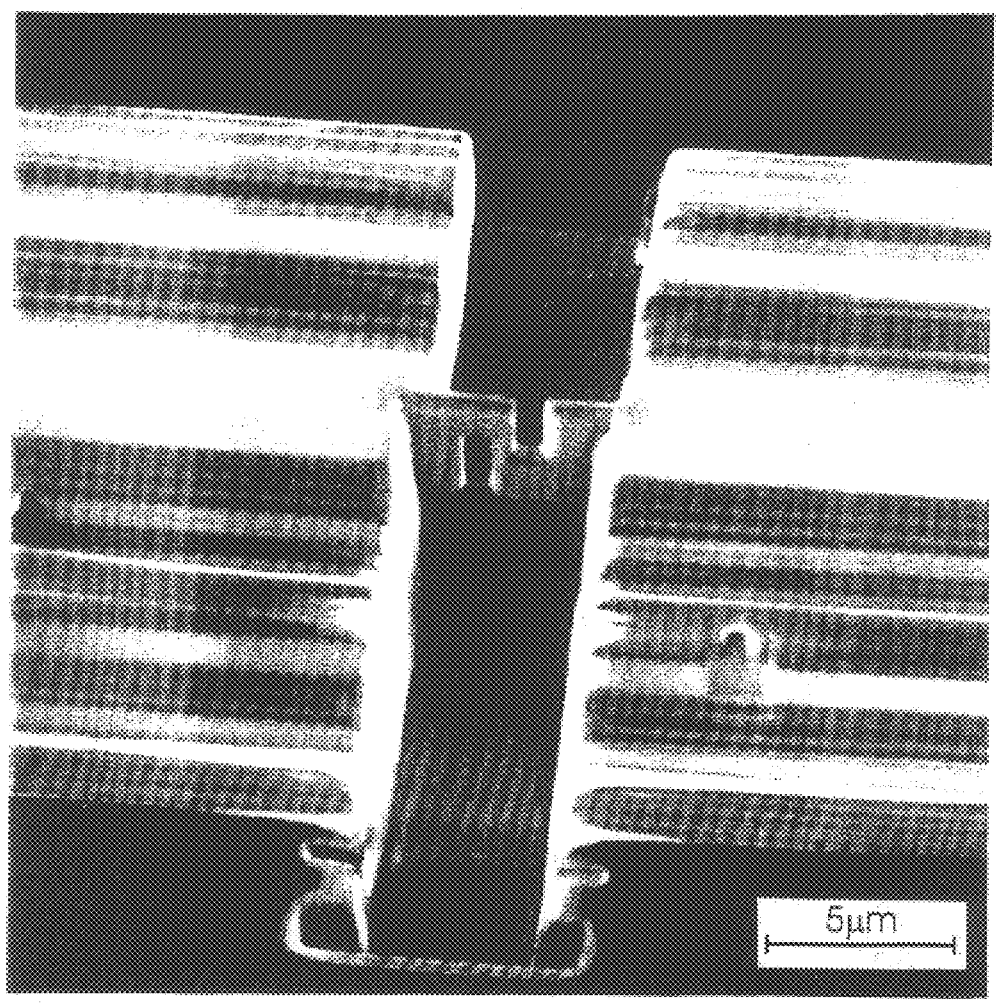

FIGS. 4(a) and 4(b) are a perspective view and a photograph relating to the embodiment of the present invention and showing the three-dimensional intrinsic Josephson junction device, which is formed through focused-ion-beam machining and which exhibits a single-electron tunnel phenomenon. FIG. 4(a) is a perspective view of the three-dimensional intrinsic Josephson junction device; and FIG. 4(b) is a photograph showing an image of secondary ions of the three-dimensional intrinsic Josephson junction device as actually fabricated.

(1) First, as shown in FIG. 4(a), a substrate 21 (e.g., a needle (of, for example, MgO, $SrTiO_3$, or $LaAlO_3$)) for growth of a layered high-temperature superconductor monocrystal is prepared, and a high-temperature superconductor monocrystal (of, for example, YBCO, LSCO, or BSCCO) 22 is deposited thereon. After formation of an unillustrated resist pattern, the film is roughly etched by conventional wet etching or argon ion etching. Subsequently, the resist is removed.

(2) Subsequently, after the sample is fixed to a holder of a focused-ion-beam machining apparatus, the high-temperature superconductor monocrystal film 22 is cut accurately from the top surface thereof so as to form a bridge 25 having a length and width matching the size of a junction to be fabricated. The machining is performed by use of gallium (Ga) ions and at an acceleration voltage of 15 to 30 kV and a machining rate of 0.1 to 2.0 $\mu m^3$/min.

(3) Subsequently, the substrate 21 having the high-temperature superconductor monocrystal 22 having undergone machining is placed on the jig having an inclination of 30°. By means of automatic inclination control of the focused-ion-beam machining apparatus, the sample holder is tilted by 60°, so that machining at an angle of about 90° (270°) is enabled. Specifically, the sample holder is rotated such that the substrate 11 is positioned at the angle of about 90° (270°). Subsequently, the bridge 25 is machined from the side surface by means of the focused ion beam at an interval corresponding to the size of the junction, so that a stepped portion 25A and an opposite step portion 25B are formed.

As described above, in the present invention, a stack of c-axis-oriented thin films of a layered high-temperature conductor is machined by use of a fine machining technique using a focused ion beam. Therefore, an element having an area smaller than one square micrometer can be fabricated. Further, since the intrinsic stack structure of layered high-temperature superconductor monocrystal is machined and observed from the side surface thereof, it becomes possible to fabricate a device in such a manner that the number and areas of junctions can be controlled accurately, which have been difficult to achieve in conventional intrinsic Josephson junction devices. Further, when the capacitance of an element is controlled through control of the number and areas of junctions, a single-electron device which is formed from a layered high-temperature superconductor and which can operate at high temperature can be fabricated with high reproducibility.

The present invention realizes an intrinsic Josephson junction device having a layer structure and a single-electron tunnel device in which the number and area of joints can be controlled accurately. Further, use of a superconductor monocrystal enables application to transistors and memories for large scale integrated circuits.

In the present invention, a c-axis-oriented monocrystal of a layered high-temperature superconductor is used to obtain a tunnel junction layer formed three-dimensionally and having a very small area (not greater than one square micrometer). Therefore, a single-electron-pair tunnel junction device utilizing an intrinsic layer structure can be formed.

Figure 5A:
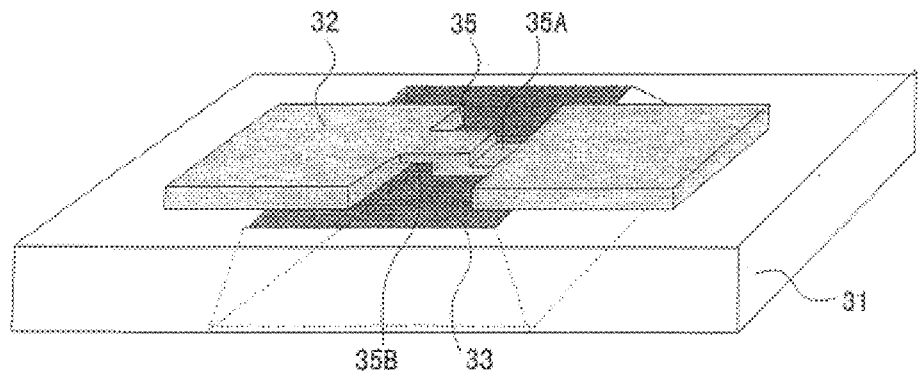
FIGS. 5(a) and 5(b) are a perspective view and a photograph of an intrinsic Josephson junction device according to another embodiment of the present invention which is formed from a monocrystal of a high-temperature superconductor through focused-ion-beam machining and in which an intrinsic Josephson junction device of a layered high-temperature superconductor is formed on a silicon substrate which has a hole having side walls inclined at 45°.
Figure 5B:
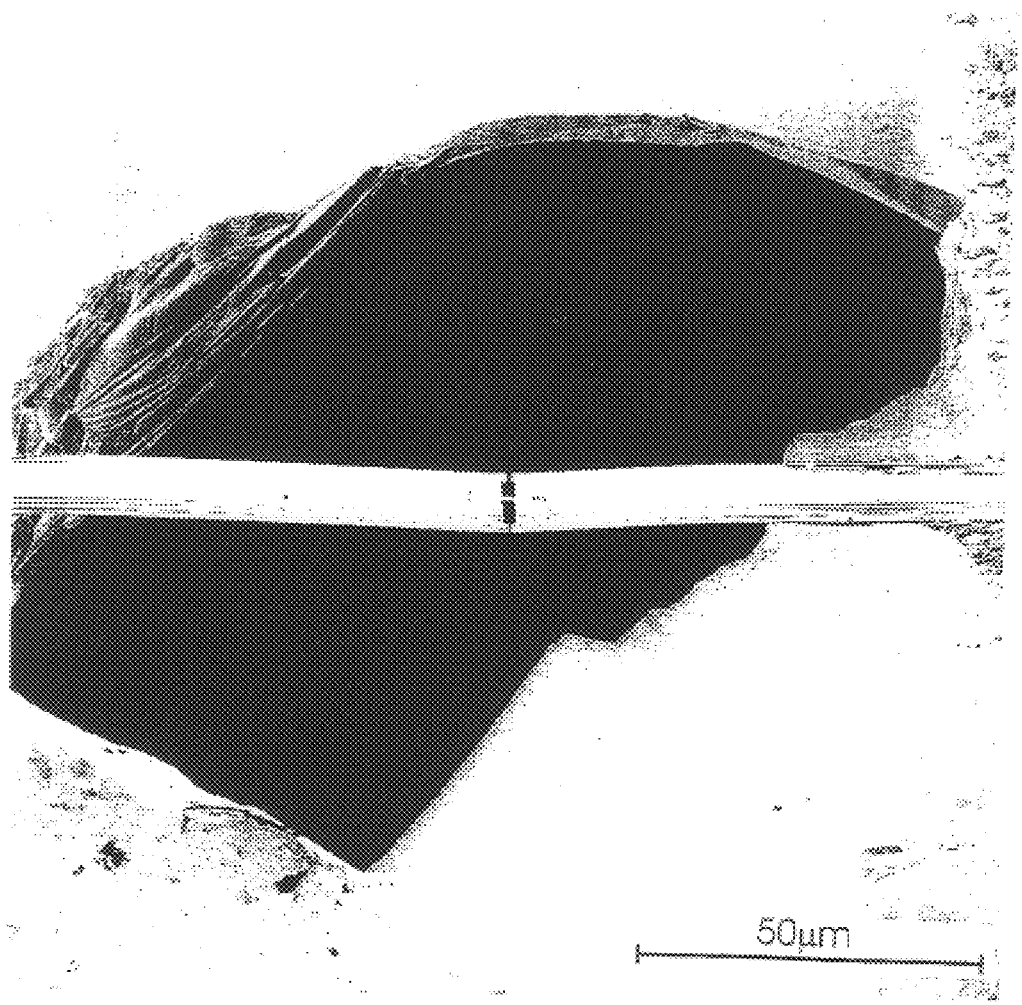

FIGS. 5(a) and 5(b) are a perspective view and a photograph of an intrinsic Josephson junction device according to another embodiment of the present invention which is formed on a substrate having a hole and which is formed of a layered high-temperature superconductor. Specifically, FIG. 5(a) is a perspective view of the intrinsic Josephson junction device; and FIG. 5(b) is a photograph showing an image of secondary ions of the intrinsic Josephson junction device as actually fabricated.

In FIG. 5(a), reference numeral 31 denotes a silicon substrate on which a layered high-temperature superconductor thin film is grown and in which a hole 33 is formed. Reference numeral 32 denotes a monocrystal of a high-temperature superconductor (for example, YBCO, LSCO, or BSCCO).

The steps for fabricating the intrinsic Josephson junction device from a c-axis-oriented monocrystal on the substrate 31 having the hole 33 are the same as those shown in FIGS. 3(a) to 3(c). After formation of the monocrystal 32 on the substrate 31, as shown in FIG. 3(d'), a bridge 35 is formed by the above-described machining method. Reference numerals 36, 37, and 38 are focused ion beams used for machining the bridge 35.

Subsequently, as shown in FIG. 3(e'), the hole 33 having walls inclined at 45° is formed in the Si substrate 31 from the reverse surface by means of anisotropic etching.

Figure 6:
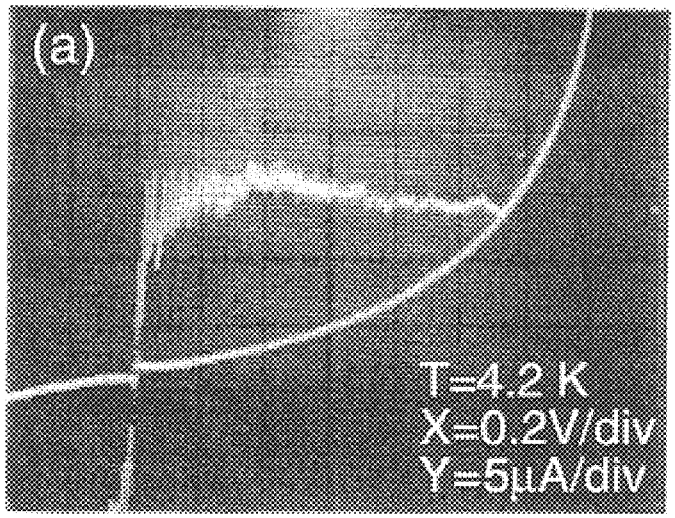
FIGS. 6(a) and 6(b) are photographs showing the output characteristics of the three-dimensional electronic element according to the embodiment of the present invention which uses a thin film or a monocrystal.
Figure 6:
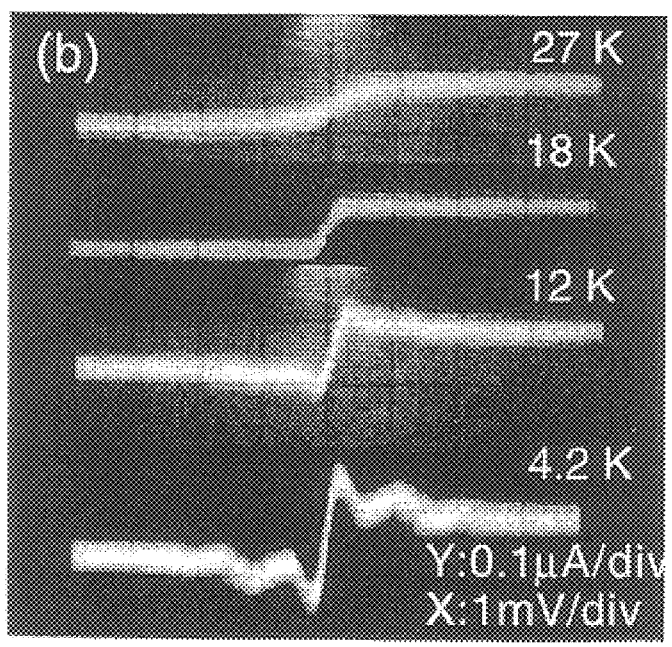

FIGS. 6(a) and 6(b) are photographs showing the output characteristics of the three-dimensional electronic element according to the embodiment of the present invention which uses a thin film and a monocrystal. Specifically, FIG. 6(a) shows the current-voltage characteristic of an intrinsic Josephson junction device using a layered high-temperature conductor (the size of the layer serving as a supercurrent path is about 2 square micrometers); and FIG. 6(b) shows the temperature dependency of the current-voltage characteristic of a three-dimensional intrinsic Josephson junction device which exhibits a single-electron tunnel phenomenon (the size of the tunnel junction layer is about 0.3 square micrometers). Up to about 12 K, a current peak is observed, which indicates that a single-electron phenomenon occurs at high temperature.

Figure 7:
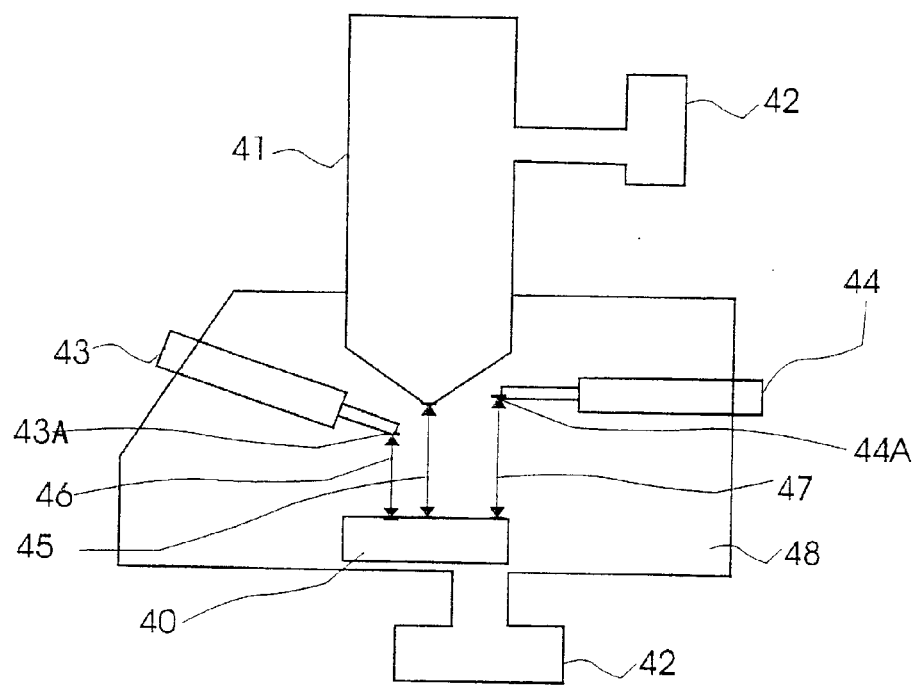
FIG. 7 is a schematic view of a fabrication apparatus for fabricating the three-dimensional electronic element according to the embodiment of the present invention.
Figure 8:
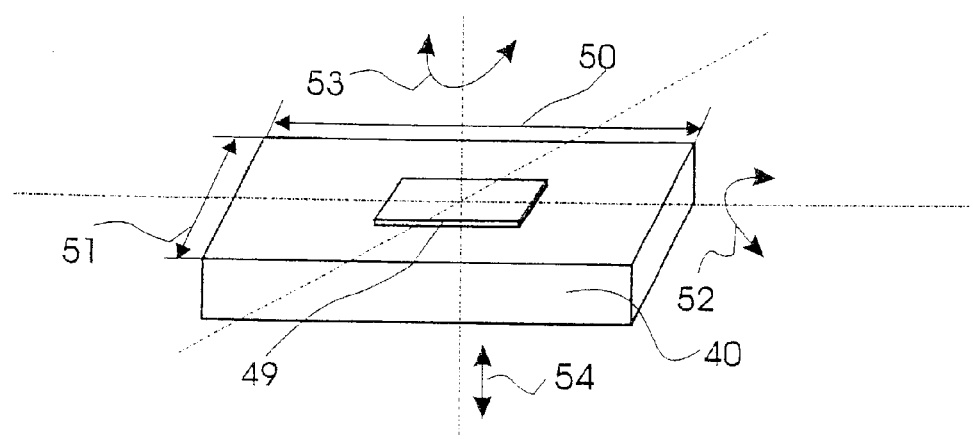
FIG. 8 is a perspective view of a sample stage of the fabrication apparatus according to the embodiment of the present invention, on which stage the three-dimensional electronic element is supported.
Figure 10:
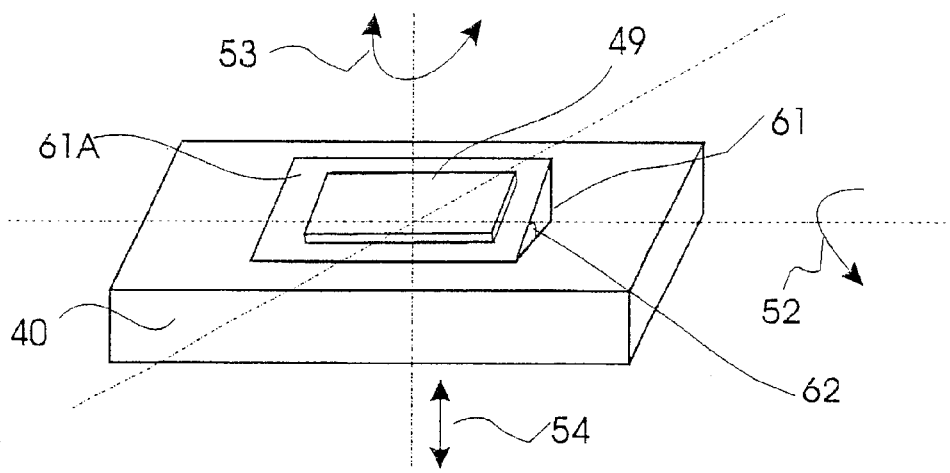
FIG. 10 is a perspective view of a sample stage of the fabrication apparatus according to another embodiment of the present invention, on which stage the three-dimensional electronic element is supported.
Figure 11:
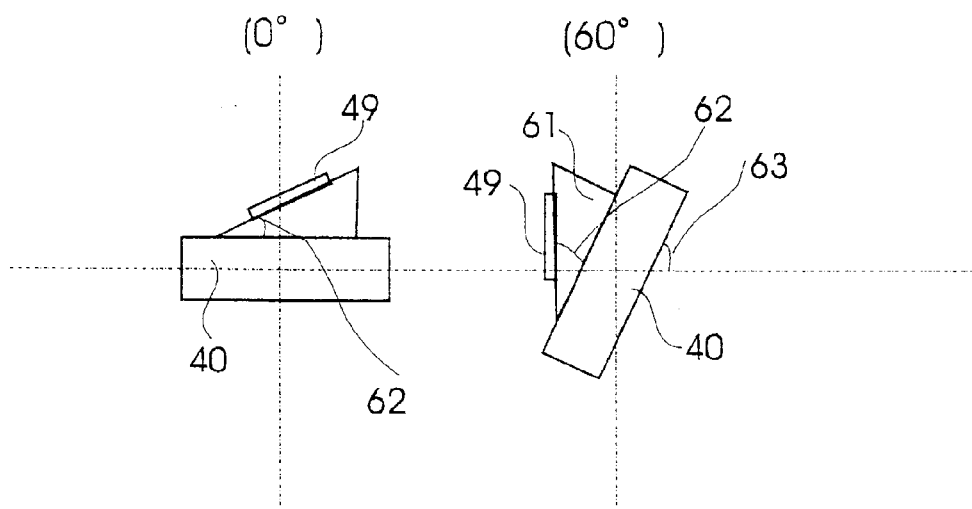
FIGS. 11(a) and 11(b) are diagrams showing a method of machining the three-dimensional electronic element by use of the fabrication apparatus according to the other embodiment of the present invention.

FIG. 7 is a schematic view of a fabrication apparatus for fabricating the three-dimensional electronic element; FIG. 8 is a perspective view of a sample stage of the fabrication apparatus, on which sample stage the three-dimensional electronic element is supported; FIGS. 9(a) to 9(d) are diagrams showing a method of machining the three-dimensional electronic element by use of the fabrication apparatus; FIG. 10 is a perspective view of a sample stage of the fabrication apparatus according to another embodiment of the present invention, on which stage the three-dimensional electronic element is supported; and FIGS. 11(a) and 11(b) are diagrams showing a method of machining the three-dimensional electronic element by use of the fabrication apparatus. Here, there is shown an example in which the tilting/rotational angle of the sample stage of a focused-ion-beam machining apparatus is controlled.

In these drawings, reference numeral 40 denotes a 6-axis sample stage according to the present invention; 41 denotes a lens barrel; 42 denotes a vacuum pump; 43 denotes a gas gun; and 44 denotes a detector. Reference numeral 45 denotes the distance between the tip end 41A of the lens barrel 41 and the 6-axis sample stage 40; 46 denotes the distance between the tip end 43A of the gas gun 43 and the 6-axis sample stage 40; and 47 denotes the distance between the tip end 44A of the detector 44 and the 6-axis sample stage 40. Reference numeral 48 denotes a sample chamber; and 49 denotes a three-dimensional electronic element serving as a sample. Reference numeral 50 denotes the length of the sample stage as measured in a direction perpendicular to the stage tilting/rotation direction; 51 denotes the length of the sample stage as measured in a direction parallel to the stage tilting/rotation direction; 52 denotes the stage tilting/rotation direction along which the stage is rotated to increase the rotational angle thereof according to the present invention; 53 denotes a horizontal rotation direction (the same as in a conventional sample stage); and 54 denotes a vertical direction (the same as in a conventional sample stage). Reference numeral 61 denotes a jig having a slant surface 61A of 0° to 90°; and 62 denotes the slant angle of the jig 61.

A conventional focused-ion-beam machining apparatus has used a sample stage capable of effecting motion in five axes; i.e., vertical movement (in two directions), horizontal rotation (in two directions); and tilting motion (in one direction up to 60°). The reason for this is that the conventional tiltable sample stage is used not for machining of a sample but for focusing of an ion beam. Since the range of motion of the sample stage is restricted by the distances (generally, about 0.1 mm to 100 mm) between the sample stage and the peripheral devices (e.g., the gas gun, the tip end of the lens barrel, and the detector), rotation in the tilting direction in excess of 60° has been difficult.

In view of the forgoing, the focused-ion-beam machining apparatus of the present invention employs a sample stage capable of effecting motion in six axes; i.e., vertical movement (in two directions), horizontal rotation (in two directions); and tilting motion (in two directions covering a range of 90° (−90°) to 360°).

In order to freely change the tilt angle of a sample within the range of 90° (−90°) to 360°, a sample stage shown in FIG. 8 or FIG. 10 must be employed in consideration of the relationship between the sample stage and the peripheral devices.

(1) First, as shown in FIG. 8, a 6-axis sample stage 40 must be installed on the focused-ion-beam machining apparatus. In consideration of the distances between the sample stage 40 and the peripheral devices and the size of a sample to be machined, the dimensions of the sample stage 40 are designed such that the rotational angle of the 6-axis sample stage 40 in the tilting direction can be changed within the range of 90° (−90°) to 360°. That is, the stage length 50 as measured in a direction perpendicular to the stage tilting/rotation direction and the stage length 51 as measured in a direction parallel to the stage tilting/rotation direction are adjusted properly.

Figure 9:
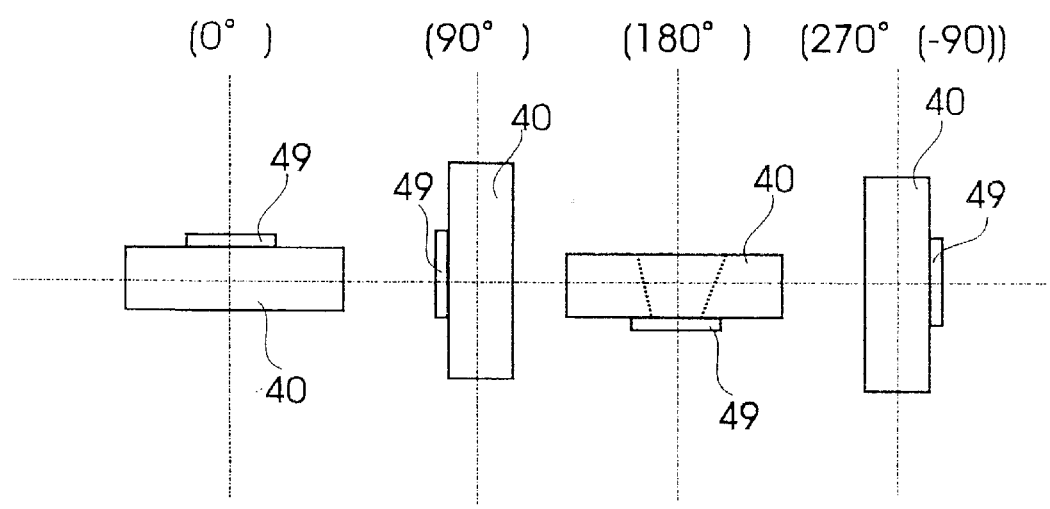
FIGS. 9(a) to 9(d) are diagrams showing a method of machining the three-dimensional electronic element by use of the fabrication apparatus according to the embodiment of the present invention.

The above-described design enables machining of a sample 49 after 90° rotation from 0° (shown in FIG. 9(a)) to 90° in the stage tilting/rotation direction 52, as shown in FIG. 9(b)). Further, it is possible to machine the sample 49 after 180° rotation in the stage tilting/rotation direction 52, as shown in FIG. 9(c)). Moreover, it is possible to machine the sample 49 after 270° (−90°) rotation in the stage tilting/rotation direction 52, as shown in FIG. 9(d)). The machining accompanied by the 180° rotation in the stage tilting/rotation direction 52 is effective particularly in the case in which a sample stage and a substrate having a hole as shown in FIG. 3(e) and FIG. 5 are used.

Further, the size of the sample stage 40 can be increased through an increase in the distance between sample stage 40 and the tip end 41A of the lens barrel 41, which increase is achieved through control of the optical system disposed inside the lens barrel 41 of the focused-ion-beam machining apparatus.

(2), Second, as shown in FIG. 10, a jig 61 having a slant angle 62 of 30° or of not greater than 90° is used. Use of the jig 61 enables the machining according to the present invention to be effected through use of a conventional sample stage.

That is, when the angular position in the stage tilting/rotation direction 52 is 0° as shown in FIG. 11(a), the sample 49 assumes a tilted orientation at an angle equal to the slant angle 62 of the jig 61. When the sample stage 40 is tilted by 60° in the stage tilting/rotation direction 52 as shown in FIG. 11(b), the sample 49 assumes a tilted orientation at an angle equal to the sum of the tilt angle 63 of the sample stage 40 and the slant angle 62 of the jig 61.

The above-described configuration enables performance of fine area machining during fabrication of an intrinsic Josephson junction device using a stack of thin films or a single crystal of a layered high-temperature superconductor of high quality, which fine area machining has conventionally been impossible. Thus, fabrication of a three-dimensional electronic element which exhibits a single-electron tunnel phenomenon at high temperature is enabled.

The present invention can be applied to a process of fabricating a magnetic body or semiconductor element utilizing anisotropy of a thin film or monocrystal, as well as fabrication of a needle-shaped probe.

The present invention is not limited to the embodiments described above. Numerous modifications and variations of the present invention are possible in light of the spirit of the present invention, and they are not excluded from the scope of the present invention.

As described in detail, the present invention provides the following effects:

(A) An electronic device utilizing a thin film or monocrystal having anisotropy can be fabricated through a fabrication process in which a layered high-temperature superconductor is machined while the sample holder of the focused-ion-beam machining apparatus is rotated from about 0° to 360° (minimum angle: about 90°).

(B) During focused-ion-beam machining, an image is captured from the side of a sample. This enables realization of a single-electron tunnel device formed of a high-temperature superconductor in which the number and area of tunnel junctions can be controlled accurately. Further, control of the electrostatic capacitance is enabled, and operation at high temperature is enabled.

(C) Fabrication of an intrinsic Josephson junction device utilizing a c-axis-oriented thin film of a layered high-temperature superconductor is enabled.

(D) Fabrication of an intrinsic Josephson junction device which utilizes a c-axis-oriented thin film of a layered high-temperature superconductor and which exhibits a single-electron tunnel phenomenon at high temperature is enabled.

(E) Fabrication of an intrinsic Josephson junction device utilizing a c-axis-oriented monocrystal of a layered high-temperature superconductor is enabled.

(F) Fabrication of an intrinsic Josephson junction device which utilizes a c-axis-oriented monocrystal of a layered high-temperature superconductor and which exhibits a single-electron tunnel phenomenon at high temperature is enabled.

(G) When an intrinsic Josephson junction device is fabricated through use of a silicon substrate having a hole which has walls inclined at 45° and is formed through anisotropic etching, direct radiation can be effected in a THz frequency range without loss in the substrate. Further, the thus-fabricated device can be used as a horn antenna.

INDUSTRIAL APPLICABILITY

As described above, the method and apparatus of the present invention for fabricating a three-dimensional element from an anisotropic material enables fabrication of an electronic device utilizing a thin film or monocrystal having anisotropy. Therefore, the method and apparatus of the present invention are suitable for semiconductor process and fabrication of a needle-like probe.

What is claimed is:

1. A method for fabricating a three-dimensional element from an anisotropic material having opposing surfaces and edge surfaces joining the opposing surfaces, comprising the steps of:

(a) forming an anisotropic thin film having a bridge on a substrate; and (b) mounting the substrate onto a sample holder having a planar mounting surface extending in two dimensions and a central axis extending through one of the two dimensions;

(c) rotating the sample holder about the central axis to bring, in succession, at least one of the opposing surfaces and an edge surface into position facing a focused ion-beam source, and (d) machining at least the one opposing surface and an edge surface of the bridge with a focused-ion-beam from the source, as the one opposing surface and the bridge end surface are brought into position facing the source.

2. A method for fabricating a three-dimensional element from an anisotropic material having opposing surfaces and edge surface joining the opposing surfaces, comprising the steps of:

(a) forming an anisotropic monocrystal having a bridge on a substrate; and (b) mounting the substrate onto a sample holder having a planar mounting surface extending in two dimensions and a central axis extending through one of the two dimensions;

(c) rotating the sample holder about the central axis to bring, in succession, at least one of the opposing surfaces and an edge surface of the bridge into position facing a focused ion-beam source, and (d) machining at least the one opposing surface and the edge surface of the bridge with a focused ion-beam from the source, as the one opposing surface and the bridge edge surface are brought into position facing the source.

3. A method for fabricating a three-dimensional element from an anisotropic material according to claim 1, wherein the bridge is machined three-dimensionally by means of focused ion-beam machining to thereby obtain a single electron tunnel junction device which is formed of a layered high-temperature superconductor and which has a tunnel junction layer.

4. A method for fabricating a three-dimensional element from an anisotropic material according to claim 1, wherein the bridge is machined three-dimensionally by means of focused ion-beam machining to thereby obtain an intrinsic Josephson junction device which is formed of a layered high-temperature superconductor and which has a supercurrent path layer.

5. A method for fabricating a three-dimensional element from an anisotropic material according to claim 3, wherein the layered high-temperature superconductor is a c-axis-oriented thin film of a layered high-temperature superconductor, and the single-electron tunnel junction device is a single-electron tunnel junction device which has a tunnel junction layer of an area not greater than one square micrometer and an intrinsic layered structure.

6. A method for fabricating a three-dimensional element from an anisotropic material according to claim 4, wherein the layered high-temperature superconductor is a c-axis-oriented thin film of a layered high-temperature superconductor, and the intrinsic Josephson junction device is an intrinsic Josephson junction device which has a supercurrent path layer of an area not greater than one square micrometer and an intrinsic layered structure.

7. A method for fabricating a three-dimensional element from an anisotropic material according to claim 3, wherein the layered high-temperature superconductor is a c-axis-oriented monocrystal of a layered high-temperature superconductor, and the single-electron tunnel junction device is a single-electron-pair tunnel junction device which has a tunnel junction layer of an area not greater than one square micrometer and an intrinsic layered structure.

8. A method for fabricating a three-dimensional element from an anisotropic material according to claim 4, wherein the layered high-temperature superconductor is a c-axis-oriented monocrystal of a layered high-temperature superconductor and the intrinsic Josephson junction device is an intrinsic Josephson junction device which has a supercurrent path layer of an area not greater than one square micrometer and an intrinsic layered structure.

9. A method for fabricating a three-dimensional element from an anisotropic material according to claim 2, wherein an intrinsic Josephson junction device is formed from a c-axis-oriented monocrystal, of a layered high-temperature superconductor on a substrate having a hole, by means of focused ion-beam machining.

10. A method for fabricating a three-dimensional element from an anisotropic material according to claim 2, wherein the bridge is machined three-dimensionally by means of focused ion-beam machining to thereby obtain a single electron tunnel junction device which is formed of a layered high-temperature superconductor and which has a tunnel junction layer.

11. A method for fabricating a three-dimensional element from an anisotropic material according to claim 2, wherein the bridge is machined three-dimensionally by means of focused ion-beam machining to thereby obtain an intrinsic Josephson junction device which is formed of a layered high-temperature superconductor and which has a supercurrent path layer.

12. A method for fabricating a three-dimensional element from an anisotropic material according to claim 10, wherein the layered high-temperature superconductor is a c-axis-oriented thin film of a layered high-temperature superconductor, and the single-electron tunnel junction device is a single-electron tunnel junction device which has a tunnel junction layer of an area not greater than one square micrometer and an intrinsic layered structure.

13. A method for fabricating a three-dimensional element from an anisotropic material according to claim 11, wherein the layered high-temperature superconductor is a c-axis-oriented thin film of a layered high-temperature superconductor, and the intrinsic Josephson junction device is an intrinsic Josephson junction device which has a supercurrent path layer of an area not greater than one square micrometer and an intrinsic layered structure.

14. A method for fabricating a three-dimensional element from an anisotropic material according to claim 10, wherein the layered high-temperature superconductor is a c-axis-oriented monocrystal of a layered high-temperature superconductor, and the single-electron tunnel junction device is a single-electron-pair tunnel junction device which has a tunnel junction layer of an area not greater than one square micrometer and an intrinsic layered structure.

15. A method for fabricating a three-dimensional element from an anisotropic material according to claim 11, wherein the layered high-temperature superconductor is a c-axis-oriented monocrystal of a layered high-temperature superconductor and the intrinsic Josephson junction device is an intrinsic Josephson junction device which has a supercurrent path layer of an area not greater than one square micrometer and an intrinsic layered structure.

16. A method in accordance with claim 1 wherein said sample holder is rotated through at least about 270° to position both of the opposing surfaces and two edge surfaces facing the source.

17. A method in accordance with claim 2 wherein said sample holder is rotated through at least about 270° to position both of the opposing surfaces and two edge surfaces facing the source.

18. A method according to claim 1 further comprising rotating the sample holder about an axis perpendicular to the central axis.

19. A method according to claim 2 further comprising rotating the sample holder about an axis perpendicular to the central axis.

* * * * *

UNITED STATES PATENT AND TRADEMARK OFFICE
CERTIFICATE OF CORRECTION

PATENT NO. : 6,605,225 B1 Page 1 of 1
DATED : August 12, 2003
INVENTOR(S) : Yamashita et al.

It is certified that error appears in the above-identified patent and that said Letters Patent is hereby corrected as shown below:

Title page,
Item [75], Inventors, "Sendai" should read -- Miyagi --.

Column 10,
Line 64, "surface" should read -- surfaces --.

Signed and Sealed this

Eighteenth Day of May, 2004

JON W. DUDAS
*Acting Director of the United States Patent and Trademark Office*